(12) United States Patent
Beasley et al.

(10) Patent No.: US 9,739,913 B2
(45) Date of Patent: Aug. 22, 2017

(54) EXTREME ULTRAVIOLET CAPPING LAYER AND METHOD OF MANUFACTURING AND LITHOGRAPHY THEREOF

(71) Applicant: Applied Materials, Inc., Santa Clara, CA (US)

(72) Inventors: Cara Beasley, Scotts Valley, CA (US); Ralf Hofmann, Soquel, CA (US); Majeed A. Foad, Sunnyvale, CA (US); Rudy Beckstrom, III, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 71 days.

(21) Appl. No.: 14/696,322

(22) Filed: Apr. 24, 2015

(65) Prior Publication Data

US 2016/0011344 A1 Jan. 14, 2016

Related U.S. Application Data

(60) Provisional application No. 62/023,438, filed on Jul. 11, 2014.

(51) Int. Cl.
*G02B 5/08* (2006.01)
*G02B 1/14* (2015.01)
*G03F 7/20* (2006.01)

(52) U.S. Cl.
CPC ............. *G02B 5/0891* (2013.01); *G02B 1/14* (2015.01); *G02B 5/085* (2013.01); *G02B 5/0816* (2013.01); *G03F 7/20* (2013.01)

(58) Field of Classification Search
None
See application file for complete search history.

(56) References Cited

U.S. PATENT DOCUMENTS 6,228,512 B1 5/2001 Bajt et al.
6,396,900 B1 5/2002 Barbee, Jr. et al.
(Continued)

FOREIGN PATENT DOCUMENTS

JP 2005302860 A 10/2005
JP 2006173490 A 6/2006
(Continued)

OTHER PUBLICATIONS

Yulin et al., MoSi ML with enhanced TiO2 and RuO2 capping layers, Proc. of SPIE, 2008, pp. 10, vol. 6921, No. 692118, Emerging Lithographic Technologies XII.
(Continued)

*Primary Examiner* — Derek S Chapel
(74) *Attorney, Agent, or Firm* — Servilla Whitney LLC

(57) ABSTRACT

A method of manufacture of an extreme ultraviolet reflective element includes: providing a substrate; forming a multilayer stack on the substrate, the multilayer stack includes a plurality of reflective layer pairs having a first reflective layer and a second reflective layer for forming a Bragg reflector; and forming a capping layer on and over the multilayer stack, the capping layer formed from titanium oxide, ruthenium oxide, niobium oxide, ruthenium tungsten, ruthenium molybdenum, or ruthenium niobium, and the capping layer for protecting the multilayer stack by reducing oxidation and mechanical erosion.

17 Claims, 5 Drawing Sheets

(56) References Cited

U.S. PATENT DOCUMENTS

| | | | |
|---|---|---|---|
| 6,756,163 B2 | 6/2004 | Yan | |
| 6,869,734 B1 | 3/2005 | Lyons et al. | |
| 7,282,307 B2 | 10/2007 | Hector et al. | |
| 7,300,724 B2 | 11/2007 | Yan | |
| 7,599,112 B2 * | 10/2009 | Shiraishi | B82Y 10/00 359/359 |
| 7,771,895 B2 | 8/2010 | Wu et al. | |
| RE42,388 E | 5/2011 | Summers | |
| 8,144,830 B2 | 3/2012 | Yakshin et al. | |
| 8,409,770 B2 | 4/2013 | Jeong | |
| 8,501,373 B2 | 8/2013 | Schwarzl et al. | |
| 8,764,995 B2 | 7/2014 | Chang et al. | |
| 8,802,335 B2 | 8/2014 | Oh et al. | |
| 8,936,889 B2 | 1/2015 | Deweerd | |
| 2003/0008148 A1 | 1/2003 | Bajt et al. | |
| 2003/0190473 A1 | 10/2003 | Argoitia et al. | |
| 2004/0121134 A1 | 6/2004 | Bijkerk et al. | |
| 2005/0276988 A1 * | 12/2005 | Trenkler | B82Y 10/00 428/432 |
| 2006/0127780 A1 | 6/2006 | Chandhok et al. | |
| 2007/0020903 A1 | 1/2007 | Takehara et al. | |
| 2007/0054196 A1 * | 3/2007 | Lee | B82Y 10/00 430/5 |
| 2007/0090084 A1 | 4/2007 | Yan et al. | |
| 2008/0259439 A1 * | 10/2008 | Shiraishi | B82Y 10/00 359/360 |
| 2008/0268380 A1 * | 10/2008 | Murakami | G02B 5/0833 430/322 |
| 2010/0027107 A1 * | 2/2010 | Yakshin | G21K 1/062 359/360 |
| 2010/0066991 A1 | 3/2010 | Schwarzl et al. | |
| 2010/0119981 A1 | 5/2010 | Schwarzl et al. | |
| 2010/0239822 A1 * | 9/2010 | Pelizzo | B82Y 10/00 428/172 |
| 2014/0011122 A1 * | 1/2014 | Hosoya | B82Y 10/00 430/5 |
| 2014/0170536 A1 * | 6/2014 | Fukugami | G03F 1/24 430/5 |
| 2014/0205936 A1 * | 7/2014 | Kodera | G03F 1/24 430/5 |
| 2014/0268081 A1 | 9/2014 | Hofmann et al. | |
| 2016/0011345 A1 | 1/2016 | Hofmann et al. | |
| 2016/0011502 A1 | 1/2016 | Hofmann et al. | |
| 2016/0202396 A1 * | 7/2016 | Goehnermeier | G02B 5/0816 359/359 |

FOREIGN PATENT DOCUMENTS

| | | |
|---|---|---|
| KR | 1020050049011 A | 5/2005 |
| KR | 1020100127676 A | 12/2010 |

OTHER PUBLICATIONS

International Search Report & Written Opinion for PCT App No. PCT/US2015/039158 dated Oct. 14, 2015.
International Search Report & Written Opinion for PCT App No. PCT/US2015/039159 dated Oct. 14, 2015.
International Search Report and Written Opinion for PCT App # PCT/US2015/039160 dated Sep. 22, 2015.
Non-Final Office Action in U.S. Appl. No. 14/696,331 dated Sep. 19, 2016, 31 pages.
PCT International Preliminary Report on Patentability in PCT/US2015/039158 dated Jan. 26, 2017, 9 pages.

* cited by examiner

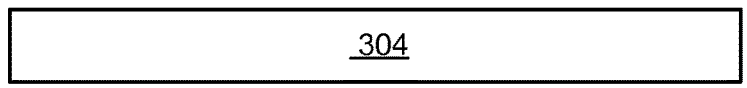
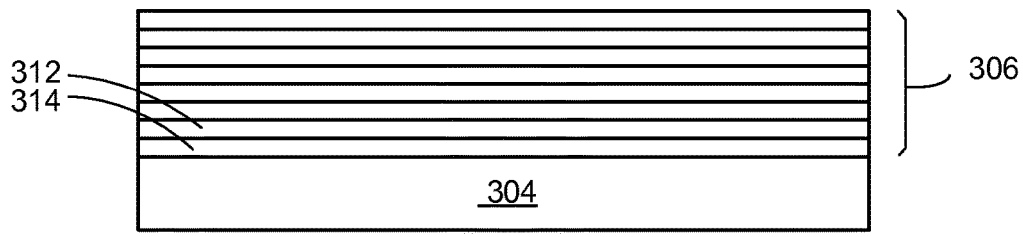
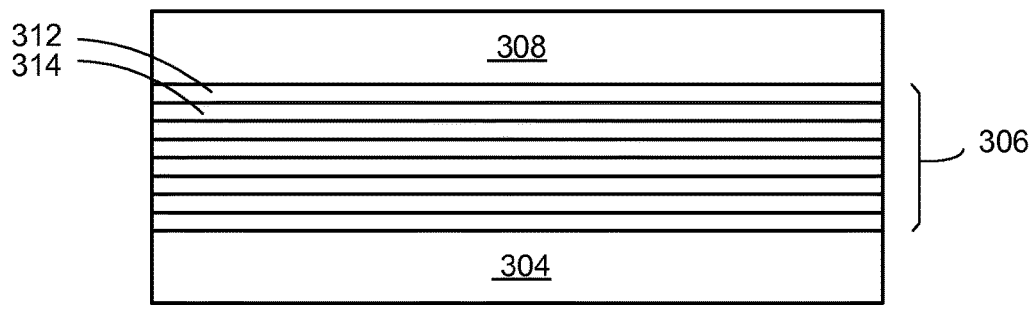
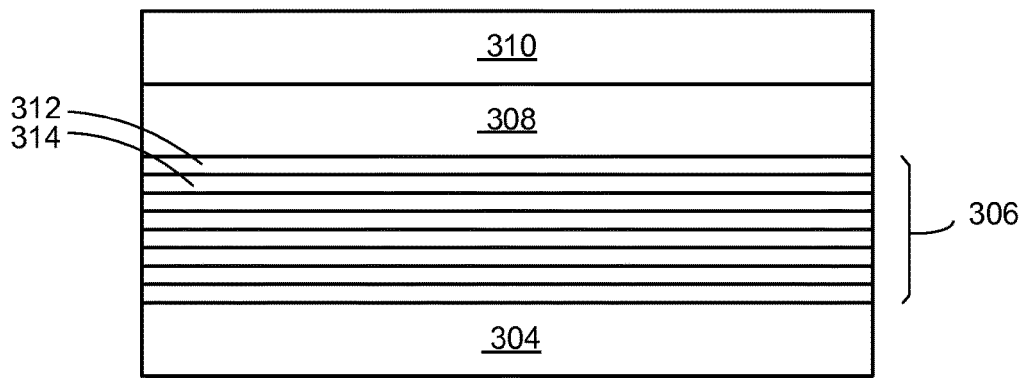

EXTREME ULTRAVIOLET CAPPING LAYER AND METHOD OF MANUFACTURING AND LITHOGRAPHY THEREOF

CROSS-REFERENCE TO RELATED APPLICATION(S)

This application claims the benefit of U.S. Provisional Patent Application Ser. No. 62/023,438 filed Jul. 11, 2014, and the subject matter thereof is incorporated herein by reference thereto.

The present application contains subject matter related to a concurrently filed U.S. patent application Ser. No. 14/696,325, filed Apr. 24, 2015. The related application is assigned to Applied Materials, Inc. The subject matter thereof is incorporated herein by reference thereto.

The present application contains subject matter related to a concurrently filed U.S. patent application Ser. No. 14/696,331, filed Apr. 24, 2015. The related application is assigned to Applied Materials, Inc. The subject matter thereof is incorporated herein by reference thereto.

TECHNICAL FIELD

The present invention relates generally to extreme ultraviolet lithography, and more particularly to capping layers, manufacturing systems, and lithography systems for extreme ultraviolet reflective elements for extreme ultraviolet lithography.

BACKGROUND

Modern consumer and industrial electronic systems are growing ever more complex. Electronic devices require higher density electronic components in smaller and more flexible packages. As component densities increase, technology changes are required to satisfy the demand for higher density devices with smaller feature sizes. Extreme ultraviolet (EUV) lithography, also known as soft x-ray projection lithography, is a photolithographic process for the manufacture of 0.13 micron, and smaller, minimum feature size semiconductor devices.

Extreme ultraviolet light, which can generally in the 5 to 50 nanometer wavelength range, is strongly absorbed by most materials. For that reason, extreme ultraviolet systems work by reflection rather than by transmission of light. Extreme ultraviolet radiation can be projected through a series of reflective components, including mirror assemblies and mask blanks coated with a non-reflective mask pattern, and directed onto semiconductor wafers to form high density, small feature size semiconductor devices.

The reflective components of extreme ultraviolet lithography systems can include reflective multilayer coatings of materials. Because of the high power levels of the extreme ultraviolet light, the remaining non-reflected extreme ultraviolet light causes thermal heating that can degrade reflectivity of the reflective components over time and can result in limited lifetimes for the reflective components.

In view of the need for the increasingly smaller feature size of electronic components, it is increasingly critical that answers be found to these problems. In view of the ever-increasing commercial competitive pressures, along with growing consumer expectations, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

SUMMARY

The present invention provides a method of manufacture of an extreme ultraviolet reflective element that includes: providing a substrate; forming a multilayer stack on the substrate, the multilayer stack includes a plurality of reflective layer pairs having a first reflective layer and a second reflective layer for forming a Bragg reflector; and forming a capping layer on and over the multilayer stack, the capping layer formed from titanium oxide, ruthenium oxide, niobium oxide, ruthenium tungsten, ruthenium molybdenum, or ruthenium niobium, and the capping layer for protecting the multilayer stack by reducing oxidation and mechanical erosion.

The present invention provides an extreme ultraviolet reflective element that includes: a substrate; a multilayer stack on the substrate, the multilayer stack includes a plurality of reflective layer pairs having a first reflective layer and a second reflective layer; and a capping layer on and over the multilayer stack, the capping layer formed from titanium oxide, ruthenium oxide, niobium oxide, ruthenium tungsten, ruthenium molybdenum, or ruthenium niobium, and the capping layer for protecting the multilayer stack by reducing oxidation and mechanical erosion.

The present invention provides an extreme ultraviolet reflective element production system that includes: a first deposition system for depositing a multilayer stack on a substrate, the multilayer stack includes a plurality of reflective layer pairs having a first reflective layer and a second reflective layer; and a second deposition system for forming a capping layer on the multilayer stack, the capping layer formed from titanium oxide, ruthenium oxide, niobium oxide, ruthenium tungsten, ruthenium molybdenum, or ruthenium niobium.

Certain embodiments of the invention have other phases or elements in addition to or in place of those mentioned above. The phases or element will become apparent to those skilled in the art from a reading of the following detailed description when taken with reference to the accompanying drawings.

BRIEF DESCRIPTION OF THE DRAWINGS

FIG. 4 is the structure of FIG. 3 in a provisioning phase of manufacturing.

FIG. 5 is the structure of FIG. 4 in a layering phase of manufacturing.

FIG. 6 is the structure of FIG. 5 in a protective phase of manufacturing.

FIG. 7 is the structure of FIG. 6 in a pre-patterning phase of manufacturing.

DETAILED DESCRIPTION

Figure 1:
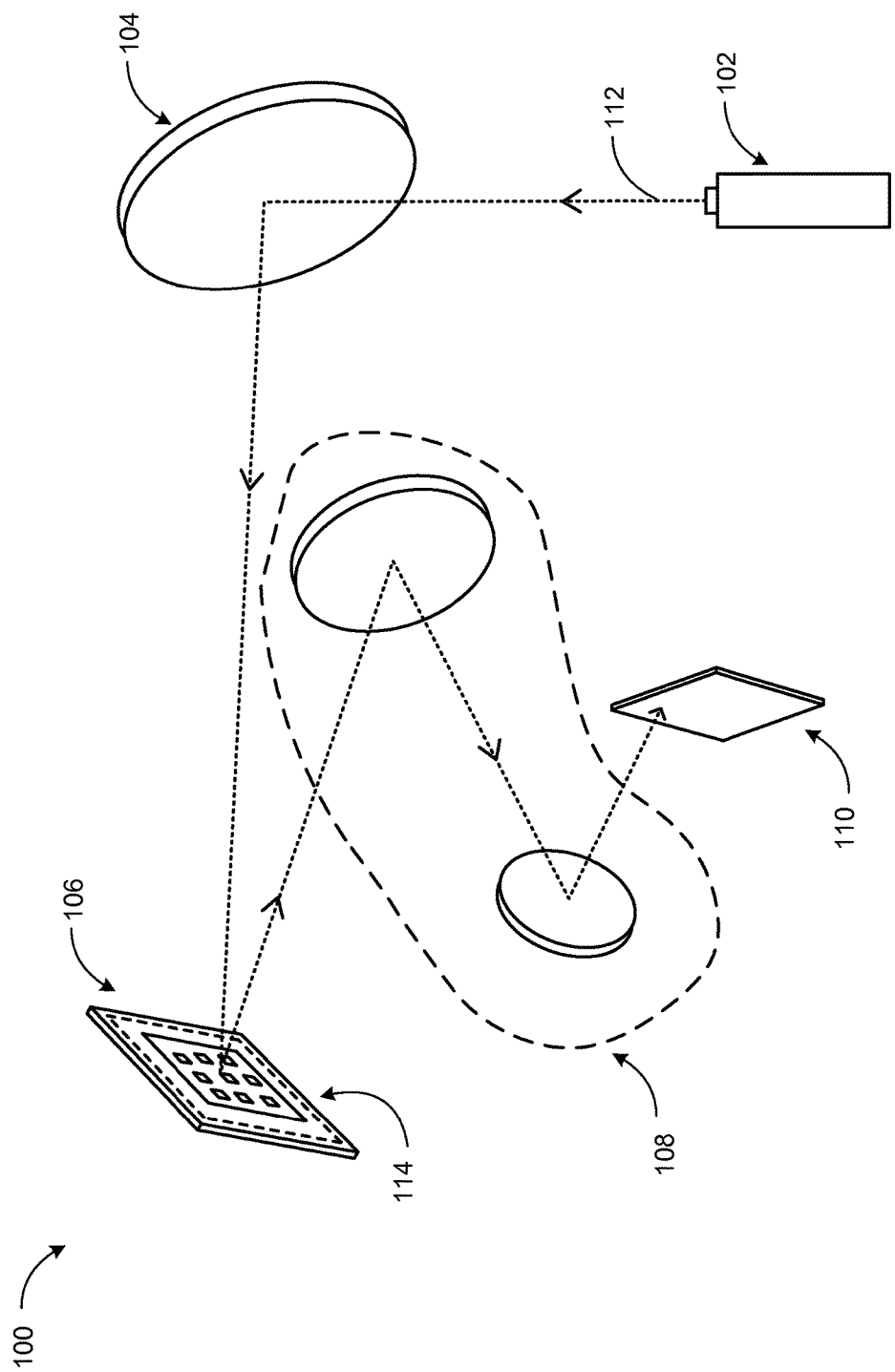
FIG. 1 is an exemplary diagram of an extreme ultraviolet lithography system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process phases are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features will be described with similar reference numerals.

For expository purposes, the term "horizontal" as used herein is defined as a plane parallel to the plane or surface of a mask blank, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" indicates that there is direct contact between elements. The term "directly on" indicates that there is direct contact between elements with no intervening elements.

The term "processing" as used herein includes deposition of material or photoresist, patterning, exposure, development, etching, sputtering, cleaning, implantation, and/or removal of the material or photoresist as required in forming a described structure. The terms "about" and "approximately" indicate that the size of an element can be determined within engineering tolerances.

Referring now to FIG. 1, therein is shown an exemplary diagram of an extreme ultraviolet lithography system 100 in a first embodiment of the present invention. The extreme ultraviolet lithography system 100 can include an extreme ultraviolet light source 102 for producing extreme ultraviolet light 112, a set of reflective components, and a target wafer 110. The reflective components can include a condenser 104, a reflective mask 106, an optical reduction assembly 108, a mask blank, a mirror, or a combination thereof.

The extreme ultraviolet light source 102 can generate the extreme ultraviolet light 112. The extreme ultraviolet light 112 is electromagnetic radiation having a wavelength in the range of 5 to 50 nanometers (nm). For example, the extreme ultraviolet light source 102 can include a laser, a laser produced plasma, a discharge produced plasma, a free-electron laser, synchrotron radiation, or a combination thereof.

The extreme ultraviolet light source 102 can generate the extreme ultraviolet light 112 having a variety of characteristics. The extreme ultraviolet light source 102 can produce broadband extreme ultraviolet radiation over a range of wavelengths. For example, the extreme ultraviolet light source 102 can generate the extreme ultraviolet light 112 having wavelengths ranging from 5 to 50 nm.

The extreme ultraviolet light source 102 can produce the extreme ultraviolet light 112 having a narrow bandwidth. For example, the extreme ultraviolet light source 102 can generate the extreme ultraviolet light 112 at 13.5 nm. The center of the wavelength peak is 13.5 nm.

The condenser 104 is an optical unit for reflecting and focusing the extreme ultraviolet light 112. The condenser 104 can reflect and concentrate the extreme ultraviolet light 112 from the extreme ultraviolet light source 102 to illuminate the reflective mask 106.

Although the condenser 104 is shown as a single element, it is understood that the condenser 104 can include one or more reflective elements such as concave mirrors, convex mirrors, flat mirrors, or a combination thereof, for reflecting and concentrating the extreme ultraviolet light 112. For example, the condenser 104 can be a single concave mirror or an optical assembly having convex, concave, and flat optical elements.

The reflective mask 106 is a reflective element having a mask pattern 114. The reflective mask 106 creates a lithographic pattern to form a circuitry layout to be formed on the target wafer 110. The reflective mask 106 can reflect the extreme ultraviolet light 112. The mask pattern 114 can define a portion of a circuitry layout.

The optical reduction assembly 108 is an optical unit for reducing the image of the mask pattern 114. The reflection of the extreme ultraviolet light 112 from the reflective mask 106 can be reduced by the optical reduction assembly 108 and reflected on to the target wafer 110. The optical reduction assembly 108 can include mirrors and other optical elements to reduce the size of the image of the mask pattern 114. For example, the optical reduction assembly 108 can include concave mirrors for reflecting and focusing the extreme ultraviolet light 112.

The optical reduction assembly 108 can reduce the size of the image of the mask pattern 114 on the target wafer 110. For example, the mask pattern 114 can be imaged at a 4:1 ratio by the optical reduction assembly 108 on the target wafer 110 to form the circuitry represented by the mask pattern 114 on the target wafer 110. The extreme ultraviolet light 112 can scan the reflective mask 106 synchronously with the target wafer 110 to form the mask pattern 114 on the target wafer 110.

Figure 2:
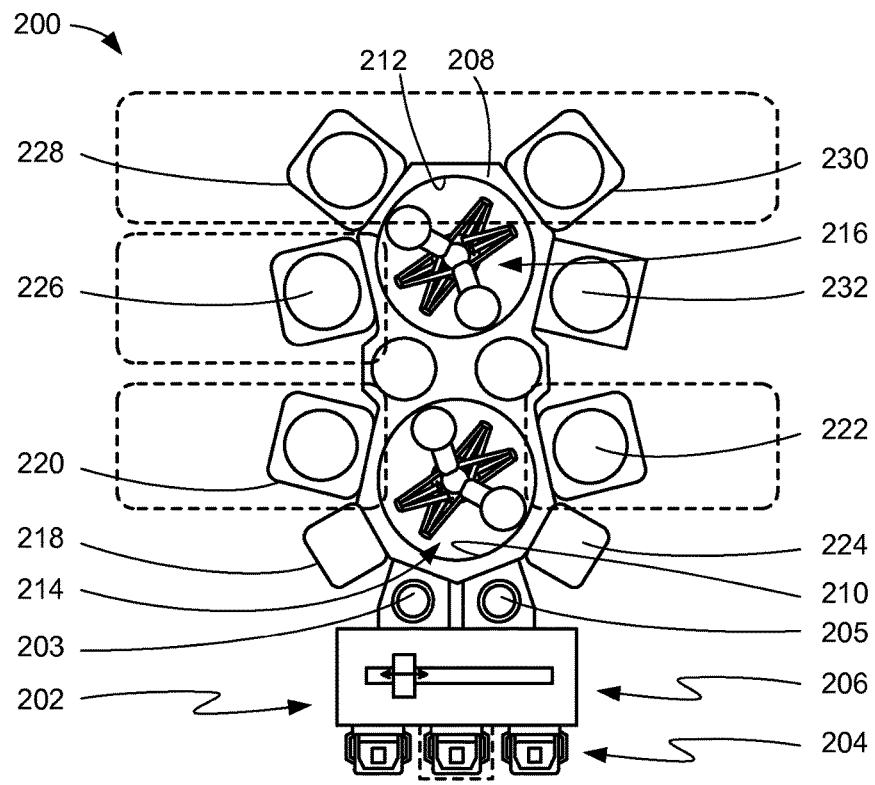
FIG. 2 is an example of an extreme ultraviolet reflective element production system.

Referring now to FIG. 2, therein is shown an example of an extreme ultraviolet reflective element production system 200. The extreme ultraviolet reflective element can include a mask blank 204, an extreme ultraviolet (EUV) mirror 205, or other reflective element.

The extreme ultraviolet reflective element production system 200 can produce mask blanks, mirrors, or other elements that reflect the extreme ultraviolet light 112 of FIG. 1. The extreme ultraviolet reflective element production system 200 can fabricate the extreme ultraviolet reflective elements applying thin coatings to source substrates 203.

The mask blank 204 is a multilayered structure for forming the reflective mask 106 of FIG. 1. The mask blank 204 can be formed using semiconductor fabrication techniques. The reflective mask 106 can have the mask pattern 114 of FIG. 1 formed on the mask blank 204 for representing electronic circuitry.

The extreme ultraviolet mirror 205 is a multilayered structure reflective in the range of extreme ultraviolet light. The extreme ultraviolet mirror 205 can be formed using semiconductor fabrication techniques. The mask blank 204 and the extreme ultraviolet mirror 205 can be similar structures, however the extreme ultraviolet mirror 205 does not have the mask pattern 114.

The extreme ultraviolet reflective elements are efficient reflectors of the extreme ultraviolet light 112. The mask blank 204 and the extreme ultraviolet mirror 205 can have an extreme ultraviolet reflectivity of greater than 60%. The extreme ultraviolet reflective elements are efficient if they reflect more than 60% of the extreme ultraviolet light 112.

The extreme ultraviolet reflective element production system 200 includes a wafer loading and carrier handling system 202 into which the source substrates 203 are loaded and from which the extreme ultraviolet reflective elements are unloaded. An atmospheric handling system 206 provides access to a wafer handling vacuum chamber 208. The wafer loading and carrier handling system 202 can include substrate transport boxes, loadlocks, and other components to transfer a substrate from atmosphere to vacuum inside the system. Because the mask blank 204 is used to form devices at a very small scale, the mask blank 204 must be processed in a vacuum system to prevent contamination and other defects.

The wafer handling vacuum chamber 208 can contain two vacuum chambers, a first vacuum chamber 210 and a second vacuum chamber 212. The first vacuum chamber 210 can include a first wafer handling system 214 and the second vacuum chamber 212 can include a second wafer handling system 216. Although the wafer handling vacuum chamber 208 is described with two vacuum chambers, it is understood that the system can have any number of vacuum chambers.

The wafer handling vacuum chamber 208 can have a plurality of ports around its periphery for attachment of various other systems. The first vacuum chamber 210 can have a degas system 218, a first physical vapor deposition system 220, a second physical vapor deposition system 222, and a pre-clean system 224. The degas system 218 is for thermally desorbing moisture from the substrates. The pre-clean system 224 is for cleaning the surfaces of the wafers, mask blanks, mirrors, or other optical components.

The physical vapor deposition systems, such as the first physical vapor deposition system 220 and the second physical vapor deposition system 222, can be used to form thin films of materials on the source substrates 203. For example, the physical vapor deposition systems can include vacuum deposition system such as magnetron sputtering systems, ion sputtering systems, pulsed laser deposition, cathode arc deposition, or a combination thereof. The physical vapor deposition systems, such as the magnetron sputtering system, can form thin layers on the source substrates 203 including the layers of silicon, metals, alloys, oxides, compounds, or a combination thereof.

The physical vapor deposition system can form reflective layers, capping layers, and absorber layers. For example, the physical vapor deposition systems can form layers of silicon, molybdenum, titanium oxide, titanium dioxide, ruthenium oxide, niobium oxide, ruthenium tungsten, ruthenium molybdenum, ruthenium niobium, chromium, tantalum, nitrides, compounds, or a combination thereof. Although some compounds are described as an oxide, it is understood that the compounds can include oxides, dioxides, atomic mixtures having oxygen atoms, or a combination thereof.

The second vacuum chamber 212 can have a first multi-cathode source 226, a chemical vapor deposition system 228, a cure chamber 230, and an ultra-smooth deposition chamber 232 connected to it. For example, the chemical vapor deposition system 228 can include a flowable chemical vapor deposition system (FCVD), a plasma assisted chemical vapor deposition system (CVD), an aerosol assisted CVD, a hot filament CVD system, or a similar system. In another example, the chemical vapor deposition system 228, the cure chamber 230, and the ultra-smooth deposition chamber 232 can be in a separate system from the extreme ultraviolet reflective element production system 200.

The chemical vapor deposition system 228 can form thin films of material on the source substrates 203. For example, the chemical vapor deposition system 228 can be used to form layers of materials on the source substrates 203 including mono-crystalline layers, polycrystalline layers, amorphous layers, epitaxial layers, or a combination thereof. The chemical vapor deposition system 228 can form layers of silicon, silicon oxides, silicon oxycarbide, carbon, tungsten, silicon carbide, silicon nitride, titanium nitride, metals, alloys, and other materials suitable for chemical vapor deposition. For example, the chemical vapor deposition system can form planarization layers.

The first wafer handling system 214 is capable of moving the source substrates 203 between the atmospheric handling system 206 and the various systems around the periphery of the first vacuum chamber 210 in a continuous vacuum. The second wafer handling system 216 is capable of moving the source substrates 203 around the second vacuum chamber 212 while maintaining the source substrates 203 in a continuous vacuum. The extreme ultraviolet reflective element production system 200 can transfer the source substrates 203 and the mask blank 204 between the first wafer handling system 214, the second wafer handling system 216 in continuous vacuum conditions.

Figure 3:
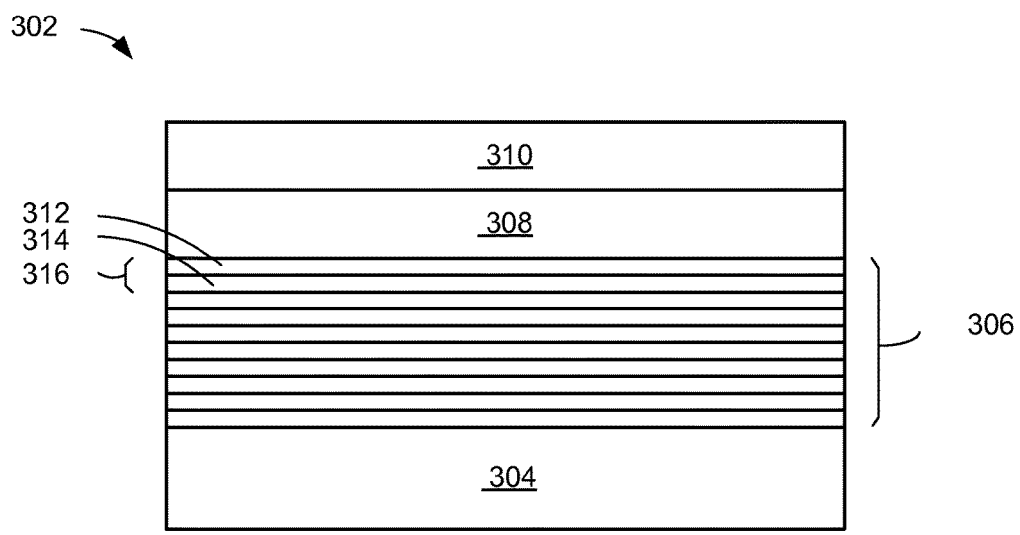
FIG. 3 is an example of an extreme ultraviolet reflective element.

Referring now to FIG. 3, therein is shown an example of an extreme ultraviolet reflective element 302. The extreme ultraviolet reflective element 302 can be the mask blank 204 or the extreme ultraviolet mirror 205 of FIG. 2. The mask blank 204 and the extreme ultraviolet mirror 205 are structures for reflecting the extreme ultraviolet light 112 of FIG. 1.

The extreme ultraviolet reflective element 302, such as the extreme ultraviolet mirror 205, can include a substrate 304, a multilayer stack 306, and a capping layer 308. The extreme ultraviolet mirror 205 can be used to form reflecting structures for use in the condenser 104 of FIG. 1 or the optical reduction assembly 108 of FIG. 1.

The mask blank 204 can include the substrate 304, the multilayer stack 306, the capping layer 308, and an absorber layer 310. The mask blank 204 can be used to form the reflective mask 106 of FIG. 1 by patterning the absorber layer 310 with the layout of the circuitry required.

In the following sections, the term for the mask blank 204 can be used interchangeably with the term of the extreme ultraviolet mirror 205 for simplicity. The mask blank 204 can include the components of the extreme ultraviolet mirror 205 with the absorber layer 310 added in addition to form the mask pattern 114 of FIG. 1.

The mask blank 204 is an optically flat structure used for forming the reflective mask 106 having the mask pattern 114. For example, the reflective surface of the mask blank 204 can form a flat focal plane for reflecting the incident light, such as the extreme ultraviolet light 112 of FIG. 1.

The substrate 304 is an element for providing structural support to the extreme ultraviolet reflective element 302. The substrate 304 can be made from a material having a low coefficient of thermal expansion (CTE) to provide stability during temperature changes. The substrate 304 can have properties such as stability against mechanical cycling, thermal cycling, crystal formation, or a combination thereof. The substrate 304 can be formed from a material such as silicon, glass, oxides, ceramics, glass ceramics, or a combination thereof.

The multilayer stack 306 is a structure that is reflective to the extreme ultraviolet light 112. The multilayer stack 306 includes alternating reflective layers of a first reflective layer 312 and a second reflective layer 314.

The first reflective layer 312 and the second reflective layer 314 can form a reflective layer pair 316. For example, the alternating layers can be formed from molybdenum and silicon. However, it is understood that the alternating layers can be formed from other substances. In another example, the first reflective layer 312 can be formed from silicon and the second reflective layer 314 can be formed from molybdenum.

Each of the alternating layers can have dissimilar optical constants for the extreme ultraviolet light 112. The alternating layers can provide a resonant reflectivity when the period of the thickness of the alternating layers is one half the wavelength of the extreme ultraviolet light. For example, for the extreme ultraviolet light 112 at a wavelength of 13 nm, the alternating layers can be about 6.5 nm thick. It is understood that the sizes and dimensions provided are within normal engineering tolerances for typical elements.

The multilayer stack 306 can be formed using the physical vapor deposition technique. The first reflective layer 312 and the second reflective layer 314 of the multilayer stack 306 can have the characteristics of being formed by the physical vapor deposition technique including precise thickness, low roughness, and clean interfaces between the layers.

The extreme ultraviolet reflective elements can include the multilayer stack 306 having alternating thin layers of materials having different optical properties which creates a Bragg reflector or mirror. Each of the alternating layers can have dissimilar optical constants for the extreme ultraviolet light 112.

The physical dimensions of the layers of the multilayer stack 306 formed using the physical vapor deposition technique can be precisely controlled to increase reflectivity. For example, the first reflective layer 312, such as a layer of silicon, can have a thickness of 4.1 nm. The second reflective layer 314, such as a layer of molybdenum, can have a thickness of 2.8 nm. The thickness of the layers dictates the peak reflectivity wavelength of the extreme ultraviolet reflective element. If the thickness of the layers is incorrect, the reflectivity at the desired wavelength 13.5 nm can be reduced.

The capping layer 308 is a protective layer allowing the transmission of the extreme ultraviolet light 112. The capping layer 308 can be formed directly on the multilayer stack 306. The capping layer 308 can protect the multilayer stack 306 from contaminants and mechanical damage. For example, the multilayer stack 306 can be sensitive to contamination by oxygen, carbon, hydrocarbons, or a combination thereof. The capping layer 308 can interact with the contaminants to neutralize them.

The capping layer 308 is an optically uniform structure that is transparent to the extreme ultraviolet light 112. The extreme ultraviolet light 112 can pass through the capping layer 308 to reflect off of the multilayer stack 306. The capping layer 308 can have a total reflectivity loss of 1% to 2%. Each of the different materials can have a different reflectivity loss depending on thickness, but all of them will be in the range of 1% to 2%.

The capping layer 308 has a smooth surface. For example, the surface of the capping layer 308 can have a roughness of less than 0.2 nm RMS (root mean square measure). In another example, the surface of the capping layer 308 can have a roughness of 0.08 nm RMS for a length between 1/100 nm and 1/1 µm. The RMS roughness will vary depending on the range it is measured over. For the specific range of 100 nm to 1 micron that roughness needs to be 0.08 nm or less. Over a larger range the roughness will be higher.

The capping layer 308 can be formed in a variety of methods. For example, the capping layer 308 can be formed on or directly on the multilayer stack 306 with magnetron sputtering, ion sputtering systems, ion beam deposition, electron beam evaporation, radio frequency (RF) sputtering, atomic layer deposition (ALD), pulsed laser deposition, physical vapor deposition, or a combination thereof. The capping layer 308 can have the physical characteristics of being formed by the magnetron sputtering technique including precise thickness, low roughness, and clean interfaces between the layers. The capping layer 308 can have the physical characteristics of being formed by the physical vapor deposition including precise thickness, low roughness, and clean interfaces between the layers.

It is understood that the capping layer 308 can be formed on intervening layers located between the multilayer stack 306 and the capping layer 308. Intervening layers can include passivation layers, protective layers, seed layers, or a combination thereof.

One of the causes of reflectivity loss is oxidation of the multilayer stack 306 due to the periodic cleaning process. To prevent this oxidation the capping layer 308 can be formed on or directly on the top of the multilayer stack 306 before the absorber layer 310 is formed.

Because most materials are opaque to the extreme ultraviolet light 112, the general contamination level in the extreme ultraviolet system must be minimized. Any contaminants can result in unwanted heating and damage from the exposure to the extreme ultraviolet light 112 if not removed. Thus, in an extreme ultraviolet system, the reflective mask 106 must be cleaned with greater frequency than with other lithographic systems.

In order to remove the small particles and other contaminants commonly found on the reflective mask 106 during use, the cleaning procedures are often aggressive. However, the harsh cleaning procedures, such as the Megasonic process, can causes pitting and degradation of the capping layer 308, which can lead to reflectivity loss and oxidation of the multilayer stack 306. Increasing the hardness and durability of the capping layer 308 can reduce the amount of damage of the multilayer stack 306 due to the cleaning procedures.

In an illustrative example, ruthenium has been used as a capping layer material because it is a good etch stop and is relatively inert under the operating conditions. However, the level of ruthenium oxidation and the chemical resistance and behavior of ruthenium and ruthenium oxide are very different, which can lead to irregularities and pitting of the surface during operation and cleaning.

The pitting can be decreased to some degree by changing the cleaning chemistry and procedure, but often there is an associated loss of cleaning efficiency. Using a more chemically inert and mechanically harder material for the capping layer 308 can result in the reflective mask 106 lasting longer.

Much of the contamination found in the extreme ultraviolet system is carbon and hydrocarbon residue from the resist outgassing. Reducing the amount of contamination provides the reflective mask 106 that could be used longer between cleaning operations. Titanium oxide is also highly resistant to most etch and clean chemistries and makes an acceptable etch stop and would survive a harsher clean with less surface damage than ruthenium.

Increasing the chemical resistance and hardness of the capping layer 308 can also be done by replacing ruthenium with a ruthenium alloy such as ruthenium tungsten, ruthenium molybdenum, or ruthenium niobium. These alloys increase the hardness of the film and reduce surface pitting and mechanical damage to the surface during cleaning. The chemical resistance of these alloys is sufficient to allow these layers to continue to act as the absorber etch stop and to allow for multiple cleans using harsher chemistries.

The capping layer 308 can be formed from a hard material to provide resilience against mechanical and chemical erosion during a cleaning process, such as an acoustic cleaning process like Megasonic cleaning. The capping layer 308 can be chemically resistant to cleaning solvents such as ammonium hydroxide, hydrogen peroxide, water, or a combination thereof.

The capping layer 308 can be formed from a variety of materials having a hardness sufficient to resist erosion during cleaning. For example, the capping layer 308 can be formed from titanium oxide, ruthenium oxide, niobium oxide, ruthenium tungsten, ruthenium molybdenum, or ruthenium niobium. The capping layer 308 can have a thickness of between 20 and 50 angstroms or 25 and 50 angstroms. For example, titanium oxides (TiOx) are generally considered chemically resistant to most solvents used in cleaning.

After cleaning, the capping layer 308 can have the physical characteristics of being exposed to a cleaning process. The capping layer 308 can have physical characteristics of erosion marks, reduced thickness, uneven wear, solvent residue, residue from the absorber layer 310, or a combination thereof. The capping layer 308 can exhibit additional physical characteristics including chemical residue caused by the interaction of the cleaning solvents and the material of the capping layer 308.

The capping layer 308 can have a minimum hardness. The degree of hardness is related to the resistance to mechanical erosion. The hardness of the capping layer 308 can vary based on the material and configuration selected. For example, ruthenium can have a Mohs hardness of 6.5 and a Brinell hardness of 2.160 gigapascals (GPa). Titanium oxide can have a Mohs hardness of 5.5-6.5. Ruthenium oxides (RuOx) can have a Brinell hardness of between 19-20 GPa. Niobium oxides (NbOx) can have a Brinell hardness of about 2 GPa.

The extreme ultraviolet reflective element 302, such as the extreme ultraviolet mirror 205, can be formed with the substrate 304, the multilayer stack 306, and the capping layer 308. The extreme ultraviolet mirror 205 has an optically flat surface and can efficiently and uniformly reflect the extreme ultraviolet light 112.

Protecting the multilayer stack 306 with the capping layer 308 formed from a hard material such as titanium oxide, ruthenium oxide, niobium oxide, ruthenium tungsten, ruthenium molybdenum, or ruthenium niobium improves reflectivity. The capping layer 308 can prevent damage to the multilayer stack 306 during manufacturing and cleaning operations. The capping layer 308 can prevent oxidation to maintain reflectivity and prevent reflectivity loss of the multilayer stack 306 during use and cleaning.

For example, the multilayer stack 306 can have a reflectivity between 62-70%. The multilayer stack 306 formed using physical vapor deposition can have reflectivity between than 66%-67%. Forming the capping layer 308 over the multilayer stack 306 formed with harder materials can help maintain the degree of reflectivity throughout the lifetime of the mask. In some cases, reflectivity up to 72% can be achieved using low roughness layers, clean interfaces between layers, improved layer materials, or a combination thereof. Using a thinner capping layer that is more resilient decreases the reflectivity loss caused by the capping layer 308.

It has been discovered that using a robust, chemically inert, harder material for the capping layer 308 increases the operational lifetime of the reflective mask 106 and allow for more efficient cleaning of the reflective masks. Forming the capping layer 308 from titanium oxide, ruthenium oxide, niobium oxide, ruthenium tungsten, ruthenium molybdenum, or ruthenium niobium provides a more resilient layer to help reduce damage to the reflective mask 106.

It has been discovered that forming the capping layer 308 using fully oxidized materials, such as titanium oxide, ruthenium oxide, or niobium oxide, improves optical performance and reduces pitting. The level of additional degradation via oxidation due to the cleaning process is reduced by using already oxidized materials.

It has been discovered that forming the capping layer 308 using titanium oxide increases reflectivity and reduces degradation. In an environment with low levels of oxygen or water vapor present, the titanium oxide film is self-cleaning with regard to carbon and hydrocarbon contamination due to its photo-catalytic properties. The photo-catalytic process involves the absorption of deep ultraviolet light to extreme ultraviolet light which would provide the advantage of decreasing the reflectance of out-of-band light, which contributes to the black boarder issues seen during exposure.

It has been discovered that forming the capping layer 308 using materials having a hardness sufficient to resist mechanical erosion and abrasion increases the operational lifetime of the mask blank 204. Using materials like titanium oxide, ruthenium oxide, niobium oxide, ruthenium tungsten, ruthenium molybdenum, or ruthenium niobium reduces the amount of abrasion due to cleaning processes and other operational processes.

It has been discovered that forming the capping layer 308 reduces the level of contaminants in the system. Using materials like titanium oxide, titanium dioxide, ruthenium oxide, niobium oxide, ruthenium tungsten, ruthenium molybdenum, or ruthenium niobium reduces the amount of contaminants because the materials can scavenge oxygen and carbon from the environment and prevent contamination of the multilayer stack 306.

The absorber layer 310 is a layer that can absorb the extreme ultraviolet light 112. The absorber layer 310 can be used to form the pattern on the reflective mask 106 by providing areas that do not reflect the extreme ultraviolet light 112. The absorber layer 310 can be a material having a high absorption coefficient for a particular frequency of the extreme ultraviolet light 112, such as about 13.5 nm. In an illustrative example, the absorber layer 310 can be formed from chromium, tantalum, nitrides, nickel, alloys, or a combination thereof. In another example, the absorber layer can be formed from an alloy of tantalum, boron, and nitrogen. The material of the absorber layer 310 are heat tolerant and have a low coefficient of thermal expansion.

The absorber layer 310 can be formed on or directly on the capping layer 308. The absorber layer 310 can be etched using a photolithography process to form the pattern of the reflective mask 106. It is understood that the absorber layer 310 can be formed on intervening layers can include passivation layers, protective layers, seed layers, planarization layers, or a combination thereof.

The extreme ultraviolet reflective element, such as the mask blank 204, can be formed with the substrate 304, the multilayer stack 306, the capping layer 308, and the absorber layer 310. The mask blank 204 has an optically flat surface and can efficiently and uniformly reflect the extreme ultraviolet light 112. The mask pattern 114 can be formed with the absorber layer 310 of the mask blank 204.

It has been discovered that forming the absorber layer 310 over the capping layer 308 increases reliability of the reflective mask 106. The capping layer 308 acts as an etch stop layer for the absorber layer 310. When the mask pattern 114 of FIG. 1 is etched into the absorber layer 310, the capping layer 308 beneath the absorber layer 310 can stop the etching action to protect the multilayer stack 306.

The first reflective layer 312, the second reflective layer 314, the capping layer 308, and the absorber layer 310 can be formed with physical vapor deposition systems. The physical vapor deposition systems can include the first physical vapor deposition system 220 of FIG. 2, the second physical vapor deposition system 222 of FIG. 2, or a combination thereof.

Although the extreme ultraviolet reflective element is shown with the substrate 304, the multilayer stack 306, the capping layer 308, and the absorber layer 310, it is understood that other layers may be included. Additional protective layers, passivation layers, or other layers can be included. For example, the extreme ultraviolet reflective element can include a planarization layer below the multilayer stack 306.

Referring now to FIG. 4, therein is shown the structure of FIG. 3 in a provisioning phase of manufacturing. The provisioning phase can include a method to provide the substrate 304. For example, the provisioning phase can provide the substrate 304 formed from an ultra-low thermal expansion material, silicon, glass, or a combination thereof.

Referring now to FIG. 5, therein is shown the structure of FIG. 4 in a layering phase of manufacturing. The layering phase can include a method to form the multilayer stack 306 on or directly on the substrate 304. The multilayer stack 306 can form alternating layers of the first reflective layer 312 and the second reflective layer 314 on the substrate 304. For example, the multilayer stack 306 can have between 10 and 50 alternating layers of molybdenum and silicon.

Referring now to FIG. 6, therein is shown the structure of FIG. 5 in a protective phase of manufacturing. The protective phase can include a method to form the capping layer 308 on the multilayer stack 306. The multilayer stack 306 can include alternating layers of the first reflective layer 312 and the second reflective layer 314 on the substrate 304. For example, the protective phase can use magnetron sputtering to deposit a metallic material on the multilayer stack 306.

Referring now to FIG. 7, therein is shown the structure of FIG. 6 in a pre-patterning phase of manufacturing. The pre-patterning phase can include a method to form the absorber layer 310 directly on the capping layer 308. For example, the pre-patterning phase can plate the absorber layer 310 on the capping layer 308.

The capping layer 308 is over the multilayer stack 306. The multilayer stack 306 can include alternating layers of the first reflective layer 312 and the second reflective layer 314 on the substrate 304.

Figure 8:
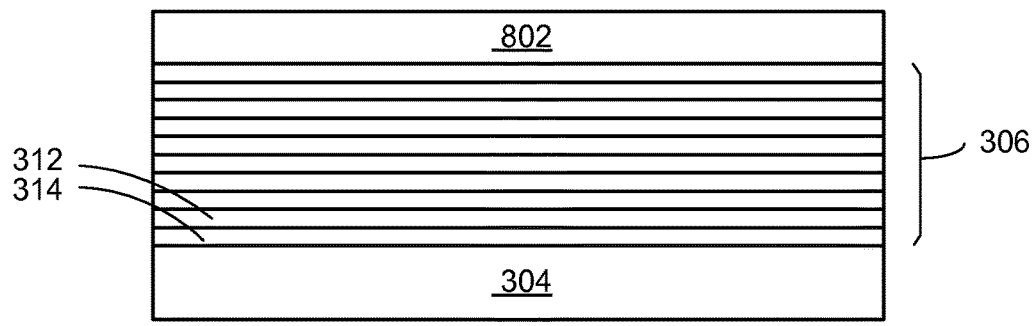
FIG. 8 is the structure of FIG. 5 in a plating phase of manufacturing.

Referring now to FIG. 8, therein is shown the structure of FIG. 5 in a plating phase of manufacturing. The metal plating phase can include a method to form the capping layer 308 of FIG. 3 on the multilayer stack 306 by first forming a metal layer 802 on or directly on the multilayer stack 306. The multilayer stack 306 can include alternating layers of the first reflective layer 312 and the second reflective layer 314 on the substrate 304.

For example, the plating phase can deposit a metallic material on the multilayer stack 306. The metallic material can be titanium, ruthenium, or niobium.

Figure 9:
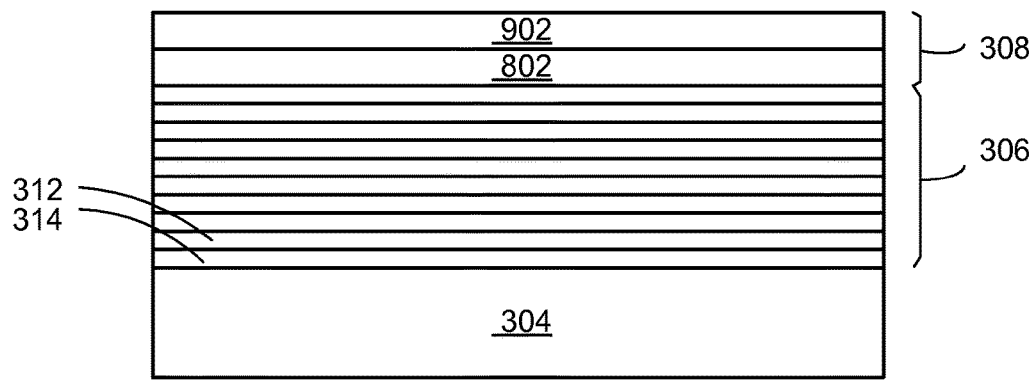
FIG. 9 is the structure of FIG. 8 in an oxidizing phase of manufacturing.

Referring now to FIG. 9, therein is shown the structure of FIG. 8 in an oxidizing phase of manufacturing. The oxidizing phase can include a method to form the capping layer 308 by oxidizing the metal layer 802 to form a metal oxide layer 902.

The metal layer 802 can be directly on the multilayer stack 306. The multilayer stack 306 can include alternating layers of the first reflective layer 312 and the second reflective layer 314 on the substrate 304.

For example, the oxidizing phase can expose the metal layer 802 to oxygen to convert the metal layer 802, such as titanium, ruthenium, or niobium, into the metal oxide layer 902, such as a layer formed from titanium oxide, ruthenium oxide, and niobium oxide, respectively.

In another example, the oxidizing phase can oxidize a portion of the metal layer 802 to form the metal oxide layer 902. The capping layer 308 can include both the metal layer 802 and the metal oxide layer 902. Although the oxidizing phase shows both the metal layer 802 and the metal oxide layer 902, it is understood that the metal layer 802 can be completely oxidized to form the capping layer 308 having only the metal oxide layer 902.

The capping layer 308 can be formed by oxidizing the metal layer 802 to form the metal oxide layer 902. The capping layer 308 can have the physical characteristics of being formed by oxidizing the metal layer 802 including partial conversion of the metal layer 802, complete conversion of the metal layer 802, uniform conversion of the metal layer 802 to the metal oxide layer 902, formation of the metal oxide layer 902 on the side of the metal layer 802 exposed from the multilayer stack 306, or a combination thereof.

Figure 10:
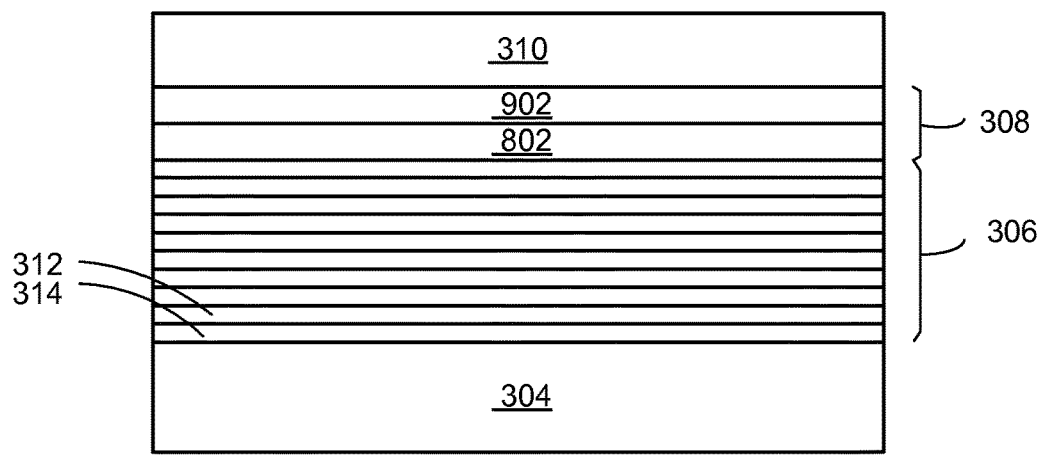
FIG. 10 is the structure of FIG. 9 in a pre-patterning phase of manufacturing.

Referring now to FIG. 10, therein is shown the structure of FIG. 9 in a pre-patterning phase of manufacturing. The pre-patterning phase can include a method to form the absorber layer 310 directly on the metal oxide layer 902. The capping layer 308 having the metal layer 802 and the metal oxide layer 902 is over the multilayer stack 306.

The multilayer stack 306 can include alternating layers of the first reflective layer 312 and the second reflective layer 314 on the substrate 304. For example, the pre-patterning phase can plate the absorber layer 310 on the metal oxide layer 902, such as a layer formed from titanium oxide, ruthenium oxide, or niobium oxide.

Figure 11:
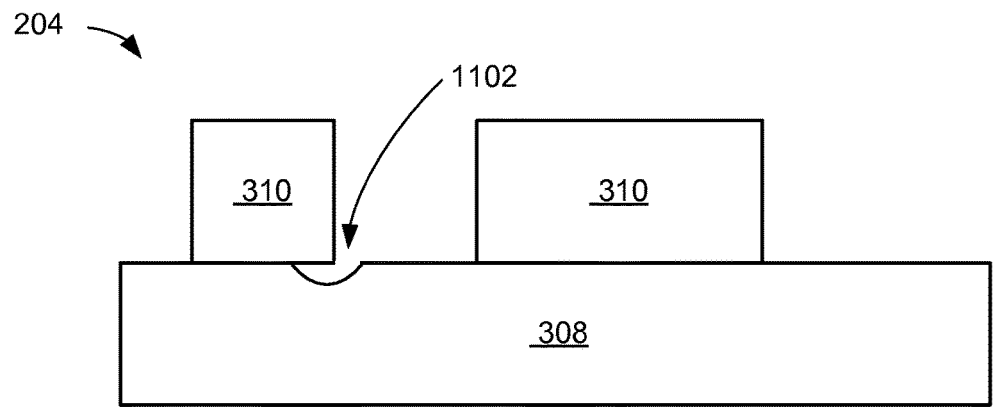
FIG. 11 is an example of erosion of the capping layer.

Referring now to FIG. 11, therein is shown an example of erosion of the capping layer 308. The capping layer 308 can form an erosion 1102 at the interface between the capping layer 308 and the absorber layer 310. The erosion 1102 is a location where material has been removed. The absorber layer 310 can be etched to form the mask pattern 114 of FIG. 1. During the etching of the absorber layer 310, the erosion 1102 can be formed in the capping layer 308 during the removal of the material of the absorber layer 310.

It has been discovered that forming the capping layer 308 from titanium oxide, titanium dioxide, ruthenium oxide, niobium oxide, ruthenium tungsten, ruthenium molybdenum, or ruthenium niobium improves the lifespan of the mask blank 204 by providing a degree of hardness and chemical resilience sufficient to resist erosion and corrosion.

Figure 12:
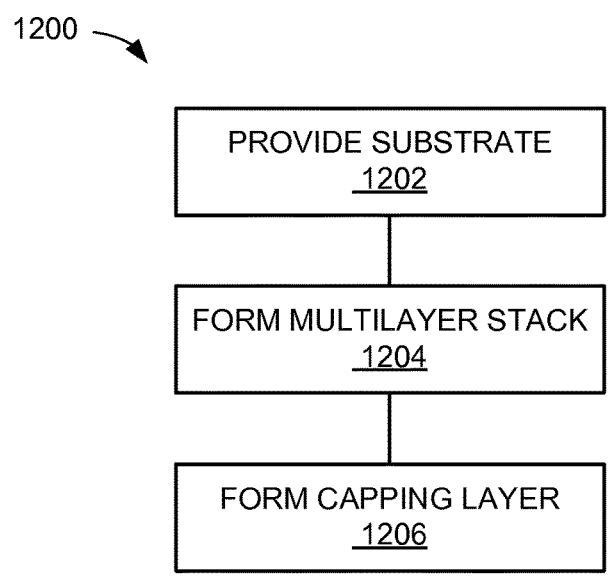
FIG. 12 is a flow chart of a method of manufacture of the extreme ultraviolet reflective element in a further embodiment of the present invention.

Referring now to FIG. 12, therein is shown a flow chart of a method 1200 of manufacture of the extreme ultraviolet reflective element in a further embodiment of the present invention. The method 1200 includes: providing a substrate in a block 1202; forming a multilayer stack on the substrate, the multilayer stack includes a plurality of reflective layer pairs having a first reflective layer and a second reflective layer for forming a Bragg reflector in a block 1204; and forming a capping layer on and over the multilayer stack, the capping layer formed from titanium oxide, ruthenium oxide, niobium oxide, ruthenium tungsten, ruthenium molybdenum, or ruthenium niobium, and the capping layer for protecting the multilayer stack by reducing oxidation and mechanical erosion in a block 1206.

Thus, it has been discovered that the extreme ultraviolet reflective element production system of the present invention furnishes important and heretofore unknown and unavailable solutions, capabilities, and functional aspects for the extreme ultraviolet reflective element production system. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing extreme ultraviolet reflective element production systems fully compatible with conventional manufacturing methods or processes and technologies.

Another important aspect of the present invention is that it valuably supports and services the historical trend of reducing costs, simplifying manufacturing, and increasing performance. These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hitherto set forth herein or shown in the accompanying drawings are to be interpreted in an illustrative and non-limiting sense.

What is claimed is:

1. A method of manufacture for an extreme ultraviolet reflective element comprising:
   providing a substrate;
   forming a multilayer stack on the substrate, the multilayer stack includes a plurality of reflective layer pairs having a first reflective layer and a second reflective layer for forming a Bragg reflector; and
   forming a capping layer on and over the multilayer stack, the capping layer formed from ruthenium tungsten, the capping layer protecting the multilayer stack by reducing oxidation and mechanical erosion.

2. The method as claimed in claim 1, wherein forming the multilayer stack includes forming the multilayer stack having the first reflective layer formed from silicon 4.1 nanometers thick and forming the second reflective layer from molybdenum 2.8 nanometers thick.

3. The method as claimed in claim 1, wherein forming the capping layer includes forming the capping layer using physical vapor deposition and forming the capping layer having a thickness between 20 angstroms and 50 angstroms and the capping layer transparent to extreme ultraviolet light.

4. The method as claimed in claim 1, wherein forming the capping layer includes forming the capping layer having a Mohs hardness of 5.5 or greater.

5. The method as claimed in claim 1, further comprising forming an absorber layer on and over the capping layer, the absorber layer formed from chromium nitride, tantalum nitride, nitrides, nickel, or a combination thereof.

6. The method as claimed in claim 1, wherein forming the capping layer includes forming the capping layer having a surface roughness of less than 0.2 nanometers root mean square (RMS).

7. An extreme ultraviolet reflective element comprising:
   a substrate;
   a multilayer stack on the substrate, the multilayer stack includes a plurality of reflective layer pairs having a first reflective layer and a second reflective layer; and
   a capping layer on and over the multilayer stack, the capping layer formed from ruthenium tungsten, the capping layer protecting the multilayer stack by reducing oxidation and mechanical erosion.

8. The extreme ultraviolet reflective element as claimed in claim 7, wherein the multilayer stack includes the first reflective layer formed from silicon 4.1 nanometers thick and the second reflective layer from molybdenum 2.8 nanometers thick.

9. The extreme ultraviolet reflective element as claimed in claim 7, wherein the capping layer has the characteristics of being formed by physical vapor deposition, has a thickness between 20 angstroms and 50 angstroms, and the capping layer transparent to extreme ultraviolet light.

10. The extreme ultraviolet reflective element as claimed in claim 7, wherein the capping layer has a Mohs hardness of 5.5 or greater.

11. The extreme ultraviolet reflective element as claimed in claim 7, further comprising an absorber layer on and over the capping layer, the absorber layer formed from chromium nitride, tantalum nitride, nitrides, nickel, or a combination thereof.

12. The extreme ultraviolet reflective element as claimed in claim 7, wherein the capping layer has a surface roughness of less than 0.2 nanometers root mean square (RMS).

13. An extreme ultraviolet reflective element lithography system comprising:
   an extreme ultraviolet light source which produces extreme ultraviolet light;
   a reflective element that can reflect the extreme ultraviolet light, the reflective element including a multilayer stack on a substrate, the
      multilayer stack includes a plurality of reflective layer pairs having a first reflective layer and a second reflective layer; and
   a capping layer on the multilayer stack, the
      capping layer formed from ruthenium tungsten.

14. The extreme ultraviolet reflective element lithography system as claimed in claim 13, wherein the first reflective layer is formed from silicon 4.1 nanometers thick and the second reflective layer from molybdenum 2.8 nanometers thick.

15. The extreme ultraviolet reflective element lithography system as claimed in claim 13, wherein the capping layer has a thickness between 20 angstroms and 50 angstroms, and the capping layer is transparent to extreme ultraviolet light.

16. The extreme ultraviolet reflective element lithography system as claimed in claim 13, wherein the capping layer has a Mohs hardness of 5.5 or greater.

17. The extreme ultraviolet reflective element lithography system as claimed in claim 13, wherein the capping layer has a surface roughness of less than 0.2 nanometers root mean square (RMS).

* * * * *